(12) United States Patent
Hirabayashi

(10) Patent No.: US 6,774,454 B2
(45) Date of Patent: Aug. 10, 2004

(54) SEMICONDUCTOR DEVICE WITH AN SILICON INSULATOR (SOI) SUBSTRATE

(75) Inventor: Atsuo Hirabayashi, Nagano (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 10/283,912

(22) Filed: Oct. 30, 2002

(65) Prior Publication Data

US 2003/0057493 A1 Mar. 27, 2003

Related U.S. Application Data

(62) Division of application No. 09/519,192, filed on Mar. 6, 2000, now Pat. No. 6,524,928.

(30) Foreign Application Priority Data

Mar. 4, 1999 (JP) .......................................... 11-056412
Oct. 5, 1999 (JP) .......................................... 11-284236

(51) Int. Cl.[7] .......................... H01L 27/01; H01L 27/12; H01L 29/00
(52) U.S. Cl. ..................... 257/510; 257/347; 257/506; 257/513; 257/523
(58) Field of Search ............................... 257/501, 506, 257/510, 513, 520, 521, 523, 524, 347

(56) References Cited

U.S. PATENT DOCUMENTS

| | | | |
|---|---|---|---|
| 3,897,273 A | 7/1975 | Marsh et al. | 148/1.5 |
| 4,796,073 A | 1/1989 | Bledsoe | 357/34 |
| 5,108,783 A | 4/1992 | Tanigawa et al. | 437/63 |
| 6,084,248 A | 7/2000 | Inoue | 257/66 |

FOREIGN PATENT DOCUMENTS

| | | | |
|---|---|---|---|
| JP | 61-32433 | | 2/1986 |
| JP | 362098620 A | | 5/1987 |
| JP | 63-38235 | | 2/1988 |
| JP | 402170551 A | | 7/1990 |
| JP | 403034326 A | | 2/1991 |
| JP | 405206264 A | * | 8/1993 |
| JP | 10-32209 | | 2/1998 |

* cited by examiner

Primary Examiner—Alexander Ghyka
(74) Attorney, Agent, or Firm—Rossi & Associates

(57) ABSTRACT

A semiconductor and a method of manufacturing thereof form a region with a sufficient gettering effect. A p-type channel MOSFET and an n-type channel MOSFET are formed in an n-type semiconductor layer, which is isolated in a form of islands on an SOI substrate. A high-concentration impurity diffused region is formed in such a manner as to surround the p-type channel MOSFET and the n-type channel MOSFET. The high-concentration impurity diffused region has a surface concentration of between $1 \times 10^{18}$ atom/cm$^3$ and $5 \times 10^{20}$ atom/cm$^3$ for achieving a desired gettering effect.

11 Claims, 17 Drawing Sheets

## SEMICONDUCTOR DEVICE WITH AN SILICON INSULATOR (SOI) SUBSTRATE

This is a Division of application Ser. No. 09/519,192 filed Mar. 6, 2000 now U.S. Pat. No. 6,524,928.

BACKGROUND

The present invention relates to a method of manufacturing a semiconductor device having an SOI substrate.

In a process of manufacturing a semiconductor device, a heavy metal pollution results in a junction leak and the deterioration of a withstand voltage of gate oxide film. Some gettering techniques are used to prevent the deterioration of the characteristics of the semiconductor device due to the heavy metal pollution. An intrinsic gettering technique, which utilizes the deposition of oxide included in a silicon wafer manufactured by a Czochralski (CZ) lifting method, is ordinarily used.

Oxide atoms, which are deposited by a heat treatment, form fine defects and integrated defects. These defects have the characteristics of forming a distorted field and easily adhering heavy metal impurity atoms. In the above-mentioned intrinsic gettering technique, an out diffusion reduces the concentration of the oxide on the surface of the wafer forming the element, and the oxide is deposited inside the wafer, thereby fixing the heavy metal.

On the other hand, there is an extrinsic gettering technique, which forms impurity diffusion layer, a polycrystal silicon, a damage layer and the like at the reverse side of the wafer, and forms a distorted field in this area to fix heavy metal impurity atoms.

Recently, a power IC end a high-speed operating LSI, in which a low voltage control circuit and a high voltage output circuit are formed in one chip, is formed on an SOI substrate that is effective for reducing an isolation area and parasitic effects. The SOI substrate is constructed in such a manner that a semiconductor layer is formed on a semiconductor substrate through an insulating film. If an oxide concentration of the semiconductor layer, in which elements are formed, is lowered to $5 \times 10^{17}$ atom/cm$^3$ or less by a heat treatment during the process of manufacturing the SOI substrate, an oxide is not deposited in a second semiconductor layer. Thus, heavy metal is not fixed inside the semiconductor layer.

Since the insulating film is between the semiconductor layer and the semiconductor substrate, the formation of a defect layer and a high-concentration impurity diffused layer for gettering would achieve a smaller effect than in the case where a defect layer and a high-concentration impurity diffused layer for gettering is formed at the reverse side of a CZ wafer.

To solve this problem, a gettering layer is formed for gettering heavy metal in the semiconductor layer, as disclosed in, for example, Japanese Patent Provisional Publication No. 10-032209. In this method, a high-concentration impurity diffused layer is provided between the semiconductor layer and the insulating film, and the heavy metal is fixed in the impurity diffused layer. This method improves the electric characteristics of the semiconductor device such as the voltage characteristics.

In a high voltage semiconductor device formed on the SOI substrate, the semiconductor layer and the insulating film share an electric field. In the method disclosed by Japanese Patent Provisional Publication No. 10-032209, the high-concentration impurity diffused layer with a gettering effect stops the spread of a depletion layer and makes it impossible to spread the electric field up to the insulating film. Therefore, it is impossible to achieve the semiconductor device with a high withstand voltage according to this reference.

Japanese Patent Provisional Publication No. 61-32433 discloses a method comprising the step of implanting ions into a semiconductor layer to thereby selectively form defect regions. In this method, the ions implanted into the semiconductor layer are of the type that is normally not used in the manufacture of semiconductor devices. Such ions are difficult to handle and are not productive. Moreover, such ions have a lower gettering effect as compared with boron and the like.

Japanese Patent Provisional Publication No. 63-38235 specifically discloses a surface concentration of impurities in an impurity diffused region with a gettering effect.

It is therefore an object of the present invention to provide a high voltage semiconductor device, which reduces the size of semiconductor elements and has a region with a sufficient gettering effect, and a manufacturing method therefore.

SUMMARY OF THE INVENTION

The above object can be accomplished by providing is a semiconductor device, which is formed of an SOI (Silicon On Insulator) on which a semiconductor layer is formed on a semiconductor substrate through an insulating film, and in which semiconductor elements are formed in said semiconductor layer of said SOI substrate. The semiconductor device has an impurity diffused region with a surface concentration of between $1 \times 10^{18}$ atom/cm$^3$ and $5 \times 10^{20}$ atom/cm$^2$ formed around activation regions in which said semiconductor elements are formed. The impurity diffused region is preferably adjacent to activation regions or in close proximity to said activation regions.

The above object can also be accomplished by a method of manufacturing a semiconductor device comprising the steps of introducing impurities into said impurity diffused region before the formation of gate oxide films in said semiconductor elements having an MOS structure. After the formation of said semiconductor elements with the MOS structure, a surface concentration of said impurity diffused region is between $1 \times 10^{18}$ atom/cm$^3$ and $5 \times 10^{20}$ atom/cm$^3$.

Preferably, the impurities forming said impurity diffused region are at least one of the following: boron, phosphorous, arsenic and fluorine. If plural kinds of impurities are mixed, a surface concentration of all the mixed impurities is preferably between $1 \times 10^{18}$ atom/cm$^3$ and $5 \times 10^{20}$ atom/cm$^3$.

According to another aspect of the present invention, a method of manufacturing a semiconductor device, which is formed by an SOI (Silicon On Insulator) on which a semiconductor layer is formed on a semiconductor substrate through an insulating film, and in which semiconductor elements are formed in said semiconductor layer of said SOI substrate, includes the steps of: forming an impurity diffused region in advance in a region in which an isolation groove is formed, and forming said isolation groove through said impurity diffused region.

As stated above, the provision of the impurity diffused region for gettering in close proximity to the activation region efficiently performs the gettering of impurities such as heavy metal introduced into the activation region. Moreover, the formation of the impurity diffused region in the isolation groove forming region before the formation of the isolation groove reduces an area wasted by the impurity diffused region. This reduces the size of the semiconductor elements.

BRIEF DESCRIPTION OF THE DRAWINGS

FIGS. 1a and 1b are cross-sectional views showing the structure of a semiconductor device according to the first embodiment of the present invention, wherein FIG. 1a is a plan view of a principal part, and FIG. 1b is a cross-sectional view taken along line X—X of FIG. 1a.

FIGS. 17a and 17b are views showing the structure of a semiconductor device according to the fourth embodiment of the present invention, wherein FIG. 17a is a plan view of a principal part, and FIG. 17b is a cross-sectional view taken along line X—X of FIG. 17a.

DETAILED DESCRIPTION

Figure 1A:
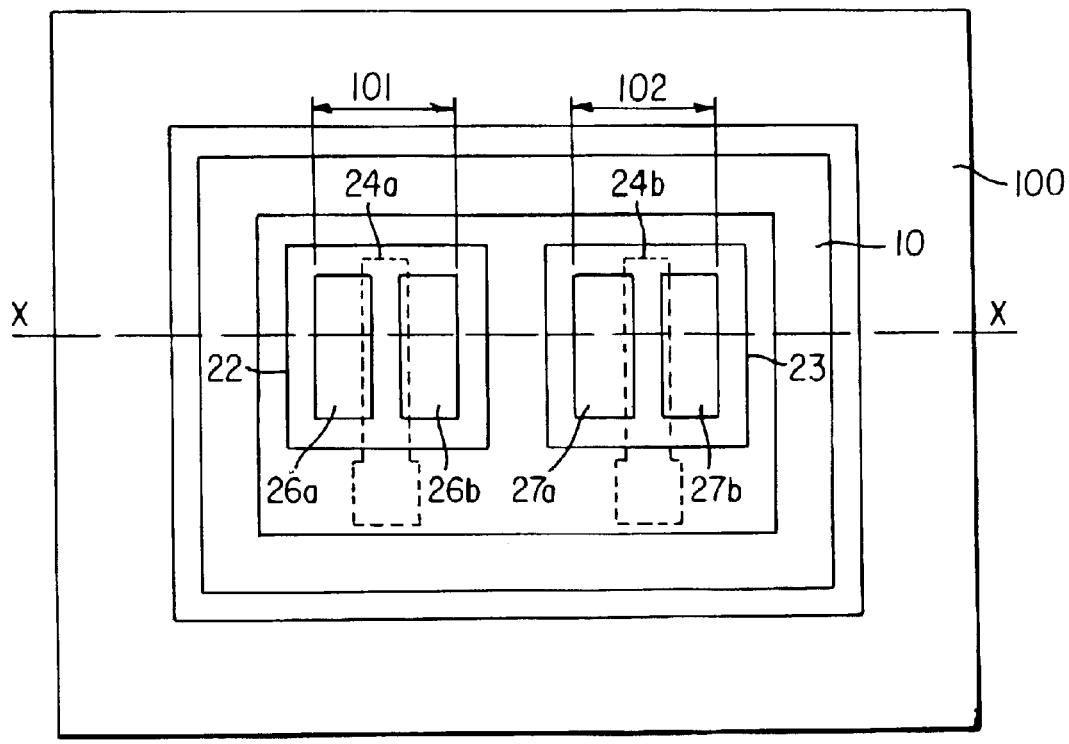
Figure 1B:
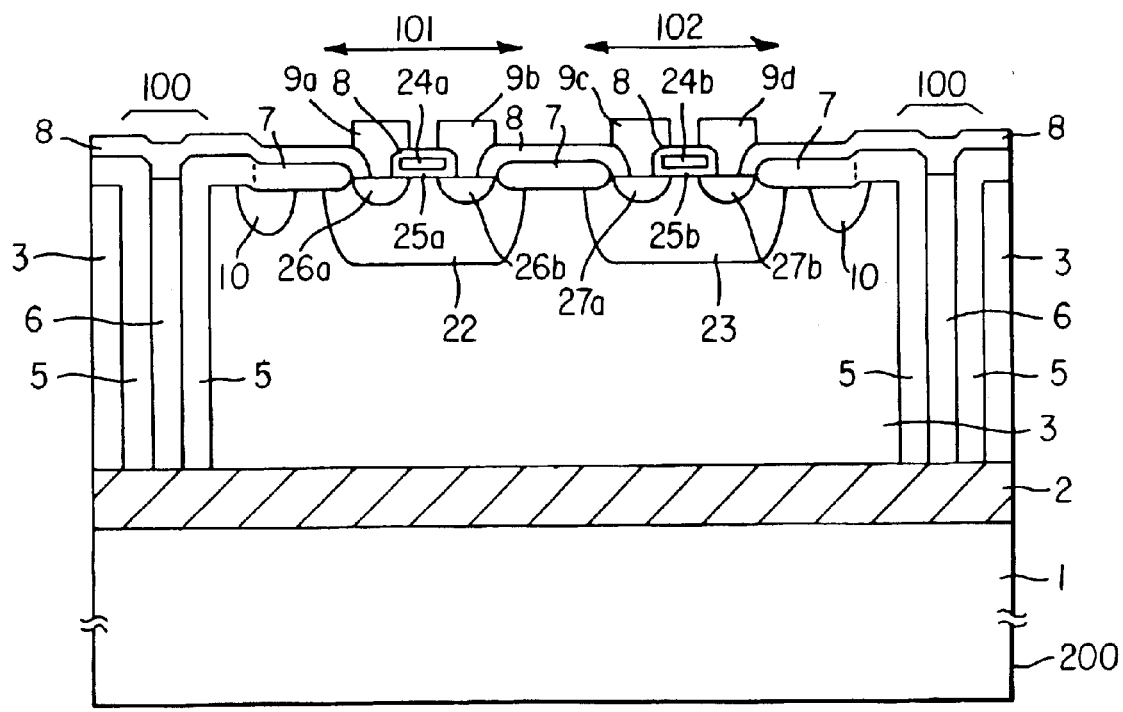

FIGS. 1a and 1b show the structure of a semiconductor device according to a first embodiment of the present invention. FIG. 1a is a plan view showing a principal part, and FIG. 1b is a cross-sectional view showing a principal part taken along line X—X in FIG. 1a. FIG. 1a is described in reference with a semiconductor surface, and illustrates only a range with respect to an isolation region 100.

In FIG. 1, a semiconductor device is manufactured by using an SOI (Silicon On Insulator) substrate 200, which has an n-type semiconductor layer 3 formed on a semiconductor substrate 1 through an insulating film 2. More specifically, the SOI substrate 200 is obtained by joining the semiconductor substrate 1 with a thick n-type semiconductor layer, on the surface of which the insulating film 2 is formed in advance, and machining the thick n-type semiconductor device to a desired thickness to thereby form the above-mentioned n-type semiconductor layer 3. FIGS. 1a and 1b show the n-type semiconductor layer 3, which has already been constructed like islands.

The n-type semiconductor layer 3 is divided into a plurality of islands by an insulating film 5 and a filling layer 6. An n-type well region 22 and a p-type well region 23 are formed in a surface layer of the divided n-type semiconductor layer 3. A gate electrode 24a is formed in the n-type well region 22 through a p-type source region 26a, a p-type drain region 26b and a gate oxide film 25a. A gate electrode 24b is formed in the p-type well region 23 through an n-source region 27a, an n-type drain region 27b and a gate oxide film 25b. Source electrodes 9a, 9c and drain electrodes 9b, 9d are respectively formed on the p-type source region 26a, the p-type drain region 26b, the n-type source region 27a, and the n-type drain region 27b to thereby form a p-type channel MOSFET 101 and an n-type channel MOSFET 102. A high-concentration impurity diffused region 10 is formed at a predetermined distance from the n-type well region 22 and the p-type well region 23 in such a manner as to surround these well regions 22, 23. A thick oxide film 7 is formed at withstand voltage structure parts of the MOSFET 101, 102, and an interlayer insulating film 8 is formed on the oxide film 7. The insulating film 5 and the filling layer 6, which are isolated in a form of islands, constitute the isolation region 100.

For example, the high-concentration impurity diffused region 10 is formed of boron as p-type impurities, and has a surface concentration of between $1\times10^{18}$ atom/cm$^3$ and $5\times10^{20}$ atom/cm$^3$, and a diffusion depth of about 4 mm. To achieve a sufficient gettering effect, the surface concentration must be higher than the concentration (normally less than $3\times18^{20}$ atom/cm$^3$) of the diffused regions (the n-type well region 22 and the p-type well region 23), which is formed before the formation of the gate oxide film 25a, 25b. For this reason, the lower limit of the surface concentration is $1\times10^{18}$ atom/cm$^3$. The upper limit of the surface concentration is $5\times10^{20}$ atom/cm$^3$ since the gettering effect becomes saturated if the surface concentration is not less than $5\times10^{20}$ atom/cm$^3$.

Phosphorous, arsenic and fluorine may be used singly or in combination instead of the boron as the impurity atoms of the high-concentration impurity diffused region 10. If phosphorous, the arsenic and the fluorine are used in combination, the same effects as mentioned above can be achieved by setting the surface concentration of the impurity diffused region within a range between $1\times10^{18}$ atom/cm$^3$ and $5\times10^{20}$ atom/cm$^3$.

Thus, the gate withstand voltage of the semiconductor device can be ensured and the source-to-drain withstand voltage can be raised by setting the surface concentration within the range between $1\times10^{18}$ atom/cm$^3$ and $5\times10^{20}$ atom/cm$^3$.

Figure 2:
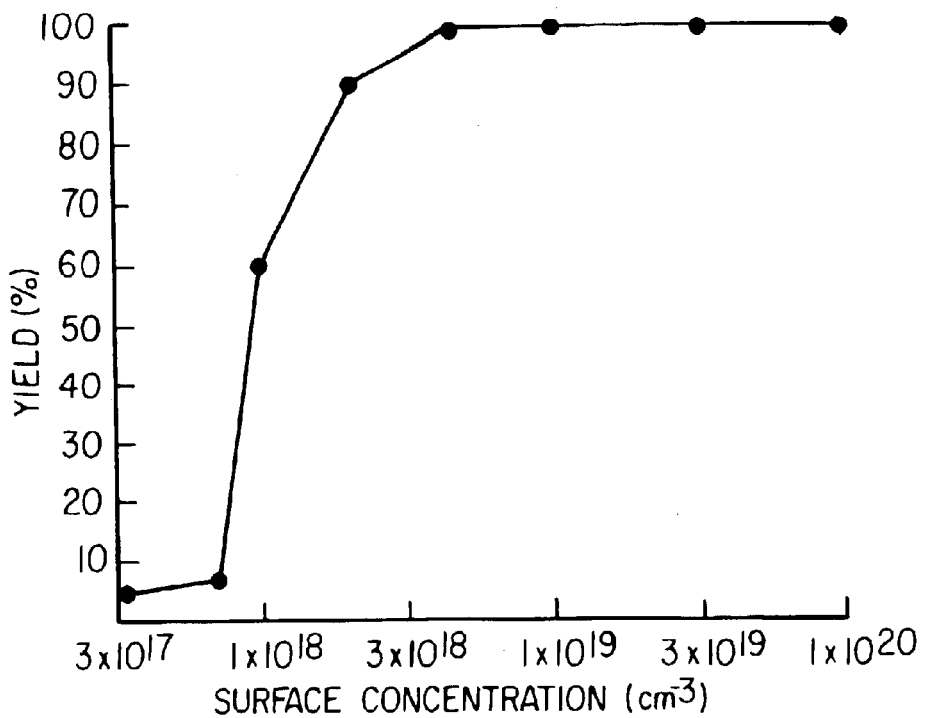
FIG. 2 is a view showing a relationship between the surface concentration of a high-concentration impurity diffused region and the yield in the device structure of FIG. 1.

FIG. 2 is a view showing a relationship between the surface concentration of the high-concentration impurity diffused region and a yield in the structure of the element of FIG. 1. FIG. 2 shows an example where boron is used as the impurity atoms in the high-concentration impurity diffused region 10. The yield means the total ratio including the gate withstand voltage and the source-to-drain voltage. The yield can be 60% or more if the surface concentration is not less than $1\times10^{18}$ atom/cm$^3$.

Figure 3:
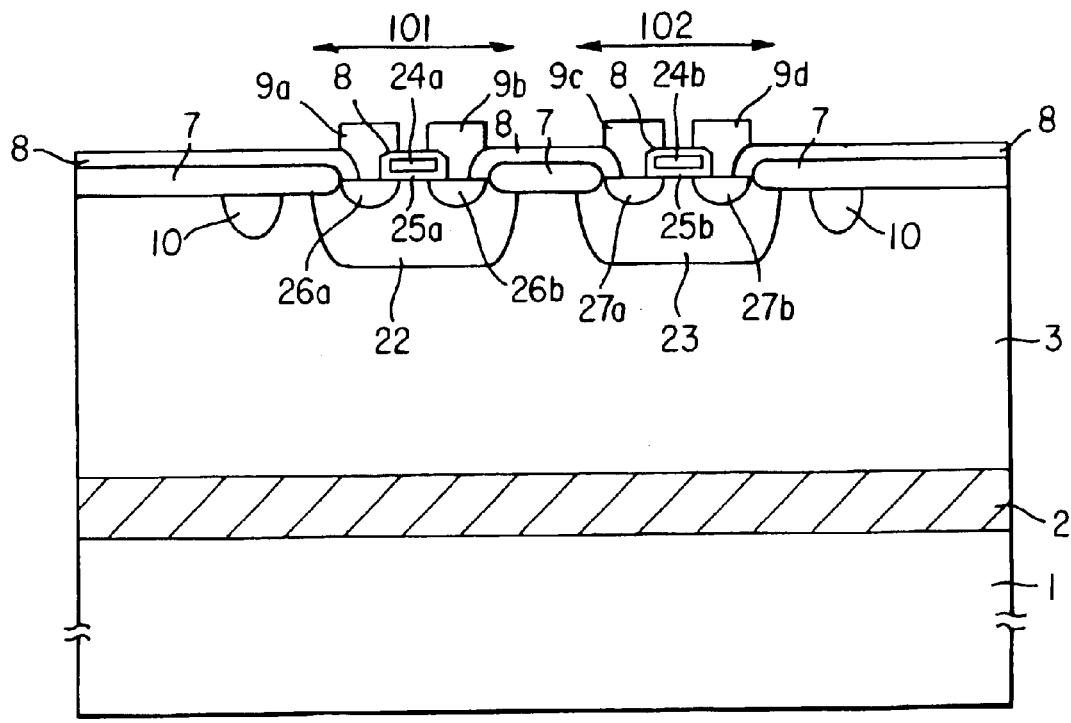
FIG. 3 is a cross-sectional view of a principal part of a semiconductor device according to the second embodiment of the present invention.

FIG. 3 is a cross-sectional view of a principal part of a semiconductor device according to a second embodiment of the present invention. FIG. 3 is different from FIG. 1 in that there is no isolation region 100 that is formed by the insulating film of FIG. 1. In the second embodiment, a junction isolation is used to isolate the elements. In this case, the same effects as those described with reference to FIG. 1 can be achieved.

FIGS. 4–16 are cross-sectional views showing a method of manufacturing the semiconductor device of FIG. 1 according to a third embodiment of the present invention. In FIGS. 4–16, the manufacturing method is described in the order of steps.

Figure 4:
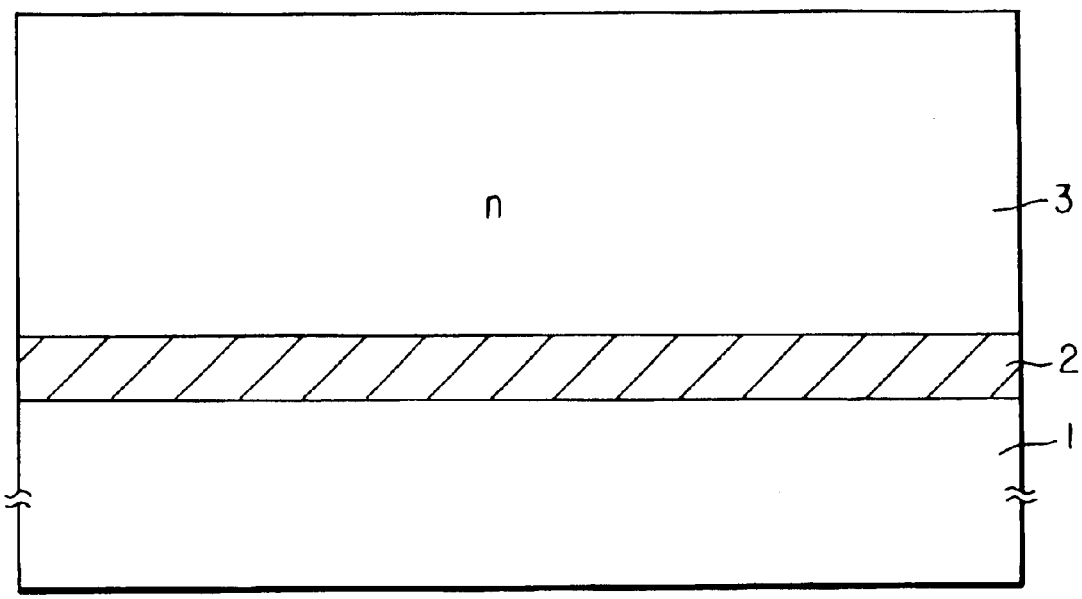
FIG. 4 is a cross-sectional view showing a process of manufacturing a semiconductor device according to the third embodiment of the present invention.

First, the SOI substrate, on which the semiconductor layer 3 with a thickness of 5–10 µm is formed, is formed on the semiconductor substrate 1 with a thickness of about 630 µm through the insulating film 2 with a thickness of 1–3 µm (FIG. 4).

Figure 5:
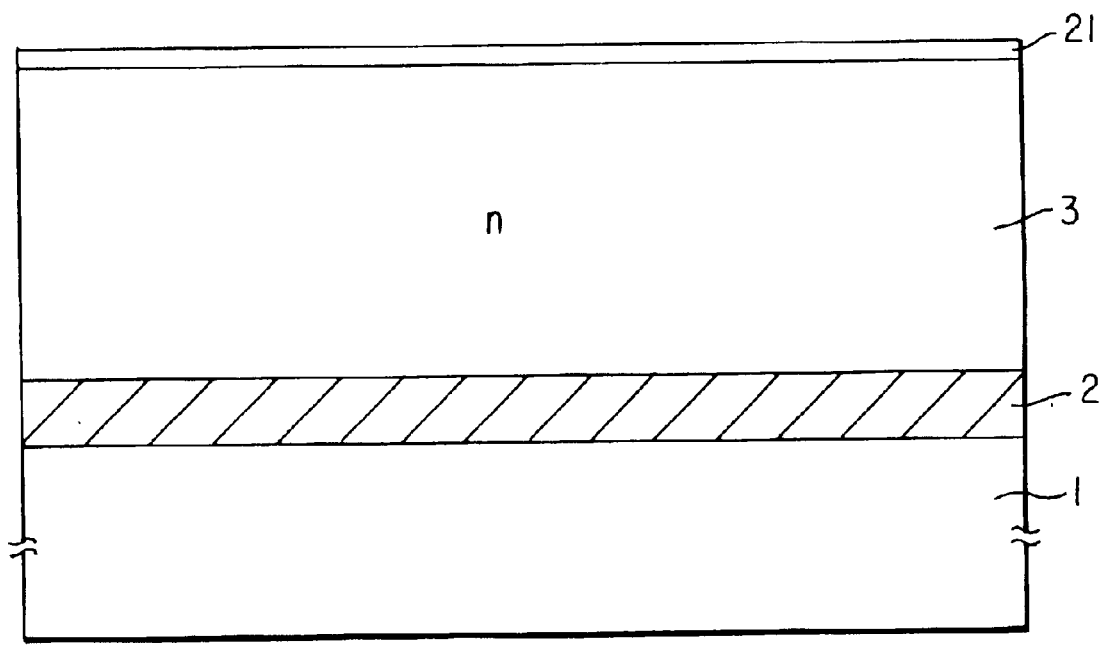
FIG. 5 is a cross-sectional view showing a process of manufacturing a semiconductor device, continuing from FIG. 4 according to the third embodiment of the present invention.

Etching mask material 21 with a thickness of about 1 µm is formed on the SOI substrate (FIG. 5).

Figure 6:
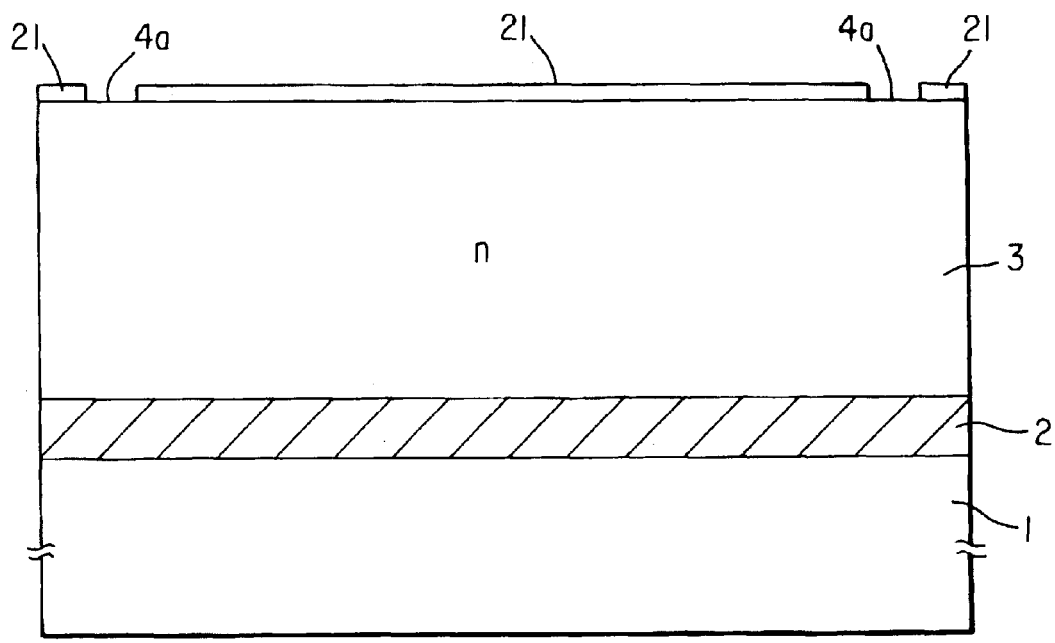
FIG. 6 is a cross-sectional view showing a process of manufacturing a semiconductor device, continuing from FIG. 5 according to the third embodiment of the present invention.

Then, isolation groove forming regions 4a are opened or formed in the etching mask material 21 by resist-patterning etching (a resist is patterned and etched by photolithography). A thermal oxidized film is used as the etching mask material 21, and an opening width of the isolation groove forming regions 4a is between 1–2 µm (FIG. 6).

Figure 7:
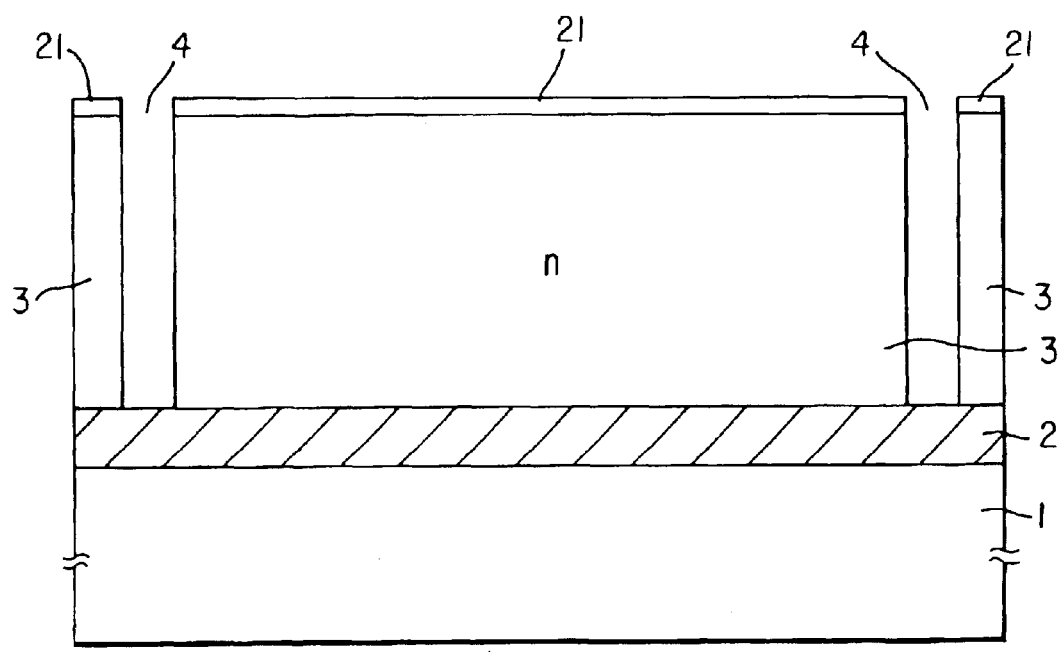
FIG. 7 is a cross-sectional view showing a process of manufacturing a semiconductor device, continuing from FIG. 6 according to the third embodiment of the present invention.

An isolation groove 4 is formed from the surface of the semiconductor layer 3 up to the insulating film 2 using the etching mask material 21 as a mask (FIG. 7).

Figure 8:
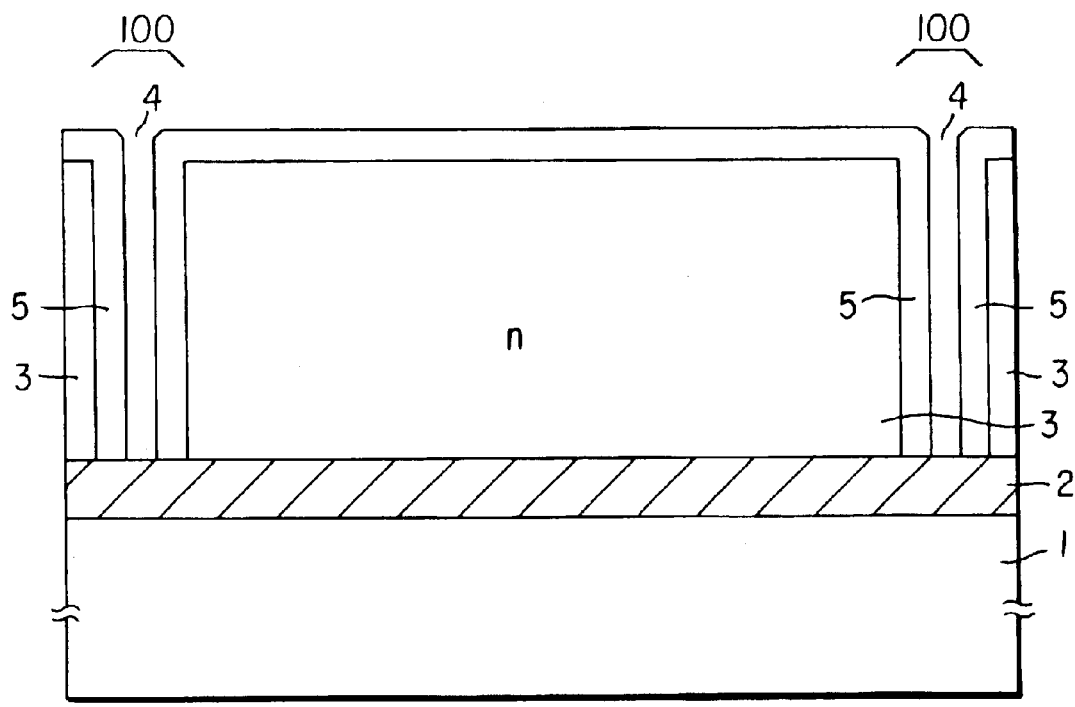
FIG. 8 is a cross-sectional view showing a process of manufacturing a semiconductor device, continuing from FIG. 7 according to the third embodiment of the present invention.

Then, the etching mask material 21 is removed, and the insulating film 5 is formed on the sidewalls of the isolation groove 4 and on the semiconductor layer 3. At this time, a thickness of the insulating film 5 is 0.5–1.0 µm (FIG. 8).

Figure 9:
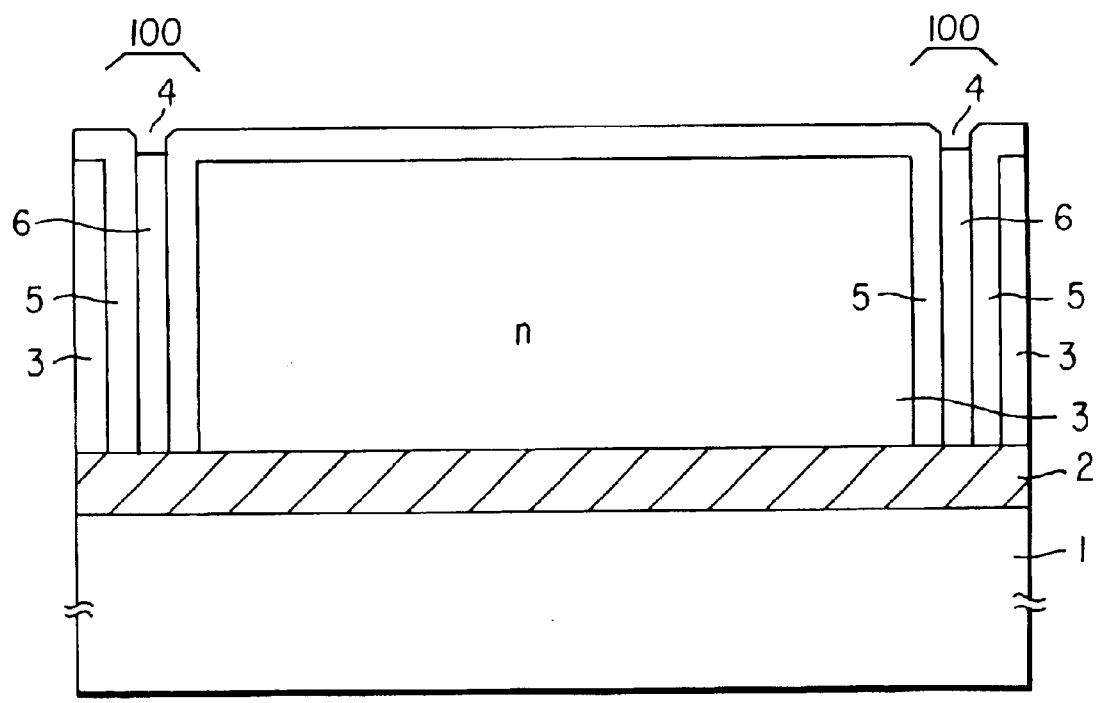
FIG. 9 is a cross-sectional view showing a process of manufacturing a semiconductor device, continuing from FIG. 8 according to the third embodiment of the present invention.

Further, the filling layer 6 is embedded in the isolation groove 4. The filling layer is composed of polycrystal silicon (FIG. 9).

Figure 10:
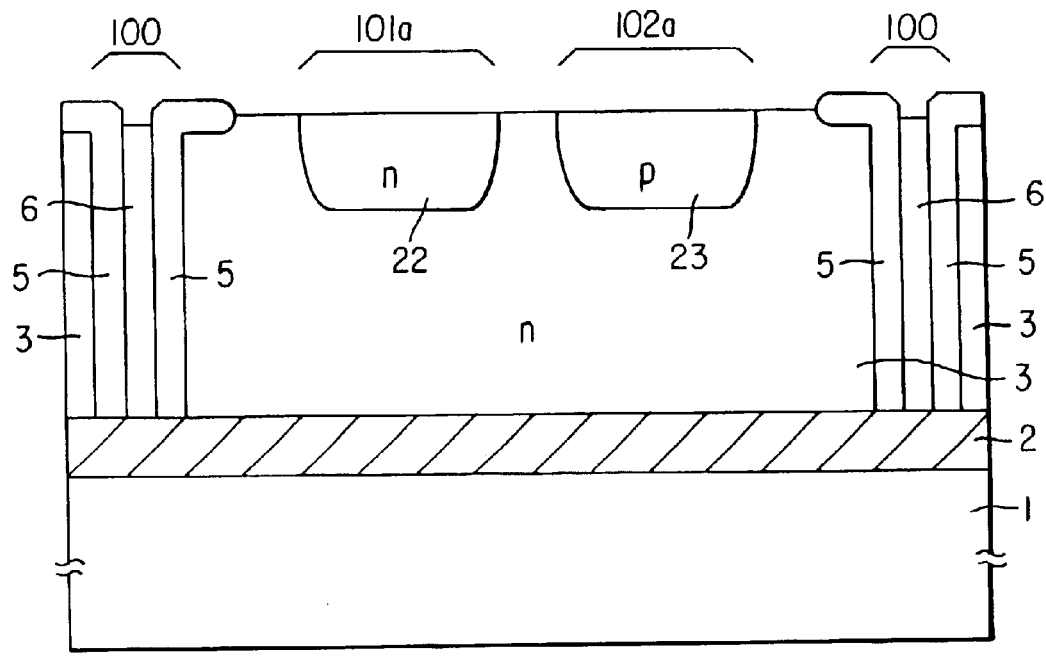
FIG. 10 is a cross-sectional view showing a process of manufacturing a semiconductor device, continuing from FIG. 9 according to the third embodiment of the present invention.

After the removal of the isolation film 5 in a region except for the isolation region 100, the n-type well region 22 and the p-type well region 23 are formed in a p-type channel MOSFET forming region 101a and an n-type channel MOSFET forming region 102a, respectively (FIG. 10).

Figure 11:
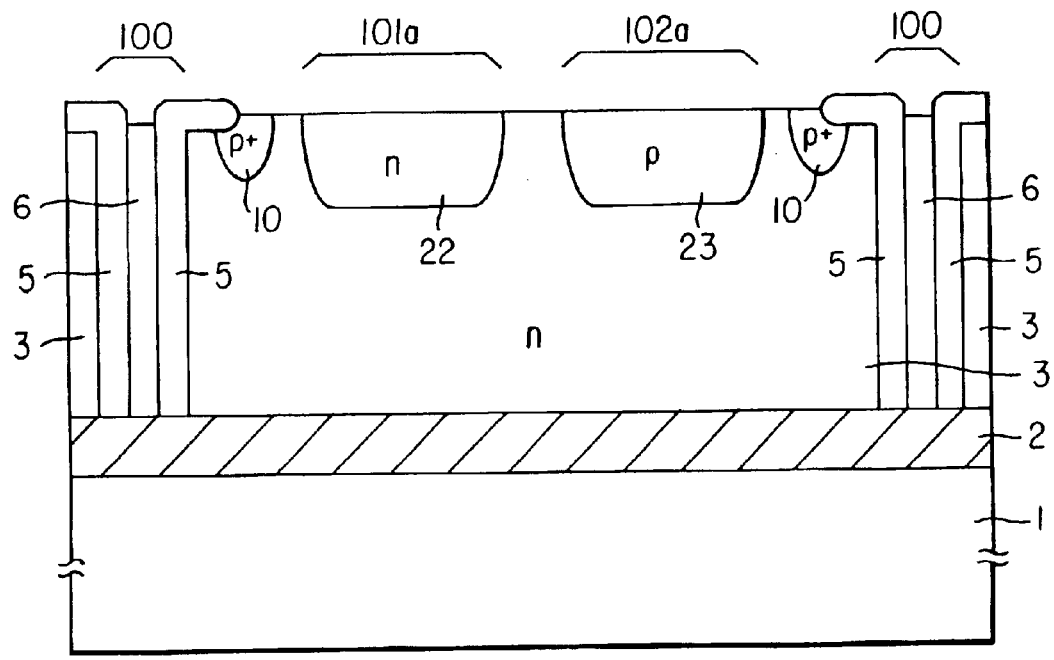
FIG. 11 is a cross-sectional view showing a process of manufacturing a semiconductor device, continuing from FIG. 10 according to the third embodiment of the present invention.

Then, the high-concentration impurity diffused region 10 is formed in a region between the isolation region 100 and the p-type channel MOSFET forming region 101a and the n-type channel MOSFET farming region 102a. Boron is used as the diffusion impurities in the impurity diffused region 10, which is formed by implanting ions of $5.0\times10^{15}$ atom/cm$^2$ at an acceleration voltage of 80 keV. The high-concentration impurity diffused region 10 thus formed has a surface concentration of $2.5\times10^{19}$ atom/cm$^3$. This surface concentration is only one example. According to the present invention, the amount of ions to be implanted is determined so that the surface concentration of the impurity diffused region 10 can be between $1\times10^{18}$ and $5\times10^{20}$ atom/cm$^3$ (FIG. 11).

Insulating film 7 is selectively formed in a region except for the p-type channel MOSFET forming region 101a and the n-type channel MOSFET forming region 102a. The insulating film 7 is a LOCOS oxide film formed by thermal oxidation, and has a thickness of 0.5–1.0 µm. The impurity diffusion layer 10 is embedded under the insulating film 7.

Figure 12:
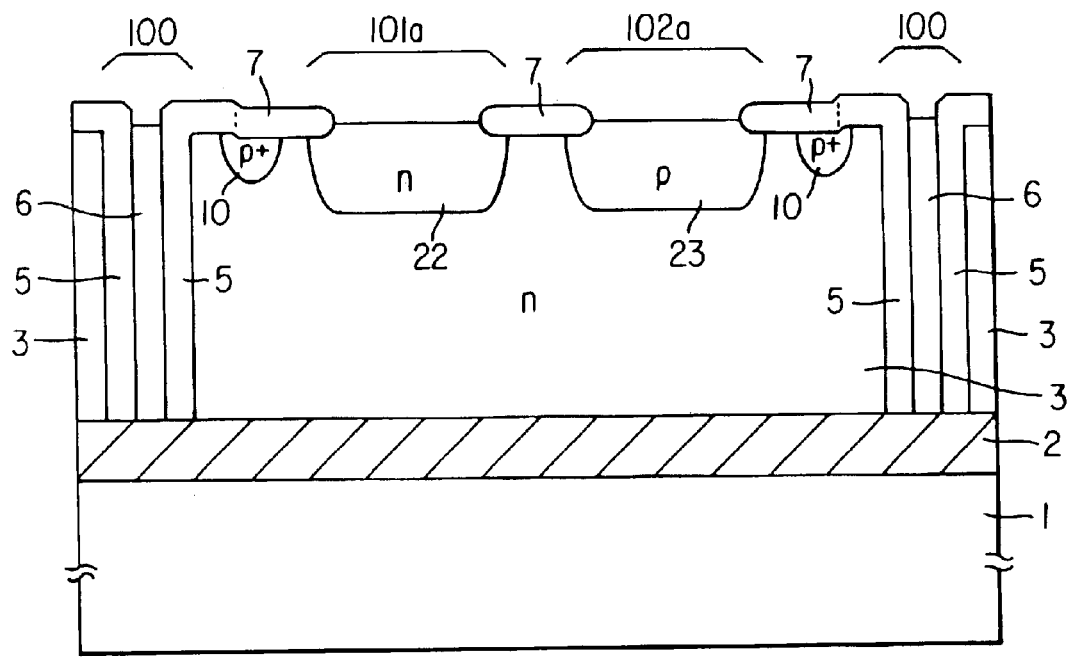
FIG. 12 is a cross-sectional view showing a process of manufacturing a semiconductor device, continuing from FIG. 11 according to the third embodiment of the present invention.
Figure 13:
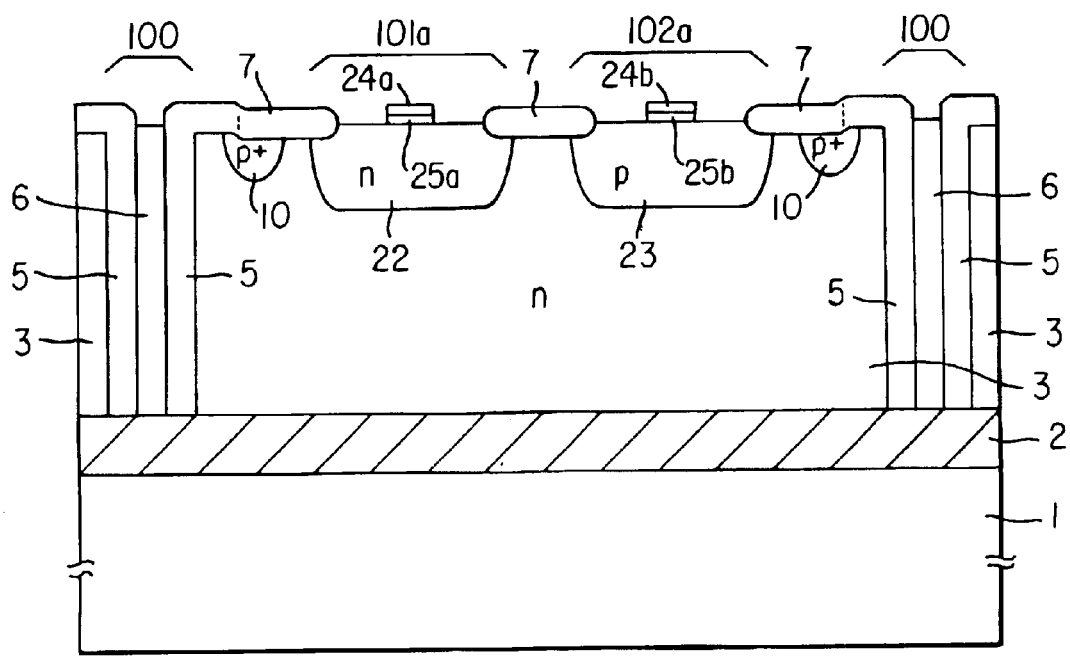
FIG. 13 is a cross-sectional view showing a process of manufacturing a semiconductor device, continuing from FIG. 12 according to the third embodiment of the present invention.
Figure 14:
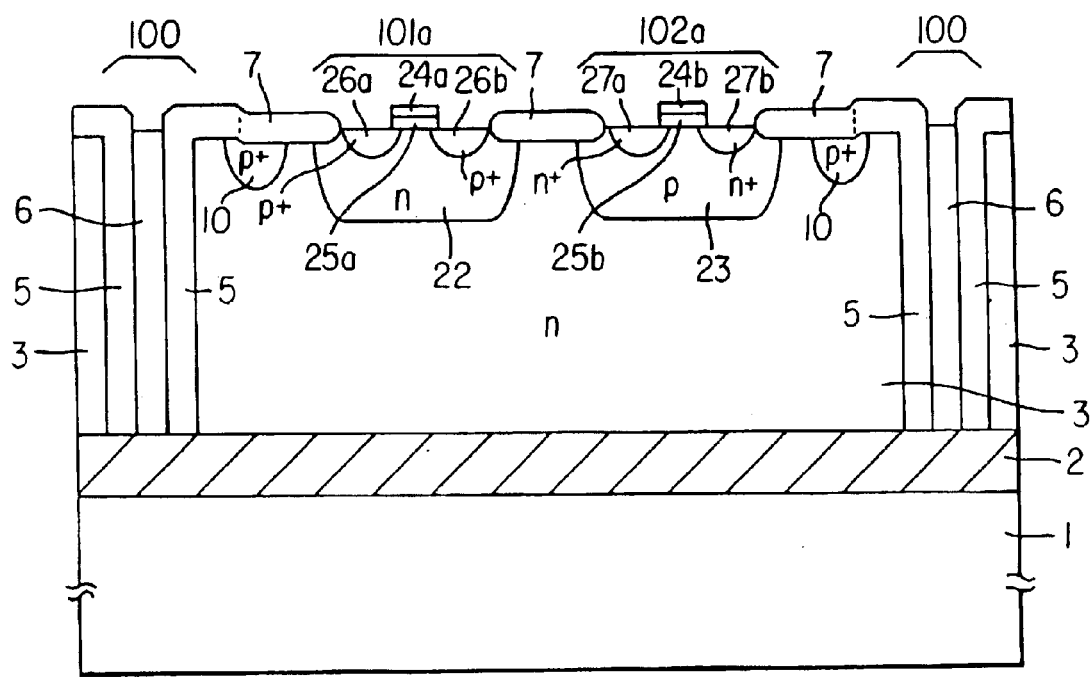
FIG. 14 is a cross-sectional view showing a process of manufacturing a semiconductor device, continuing from FIG. 13 according to the third embodiment of the present invention.
Figure 15:
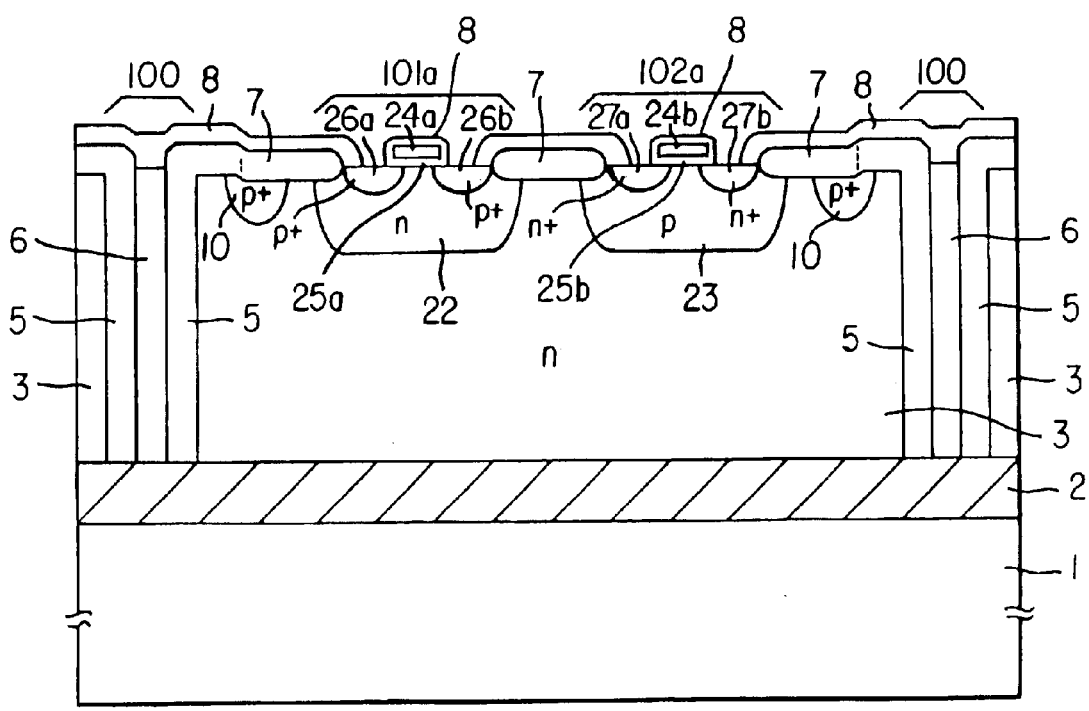
FIG. 15 is a cross-sectional view showing a process of manufacturing a semiconductor device, continuing from FIG. 14 according to the third embodiment of the present invention.

Heavy metals such as Fe and Cr, which are distributed in the semiconductor layer 3 in a region enclosed by the isolation region 100, are concentrated in the high-concentration impurity diffused region 10 in a region enclosed by the isolation region 100, and the concentration of these heavy metals mixed in the semiconductor layer 3 is lowered (FIG. 12). In this state, the gate oxide film 25a, 25b and the gate electrodes 24a, 24b are formed (FIG. 13).

Figure 16:
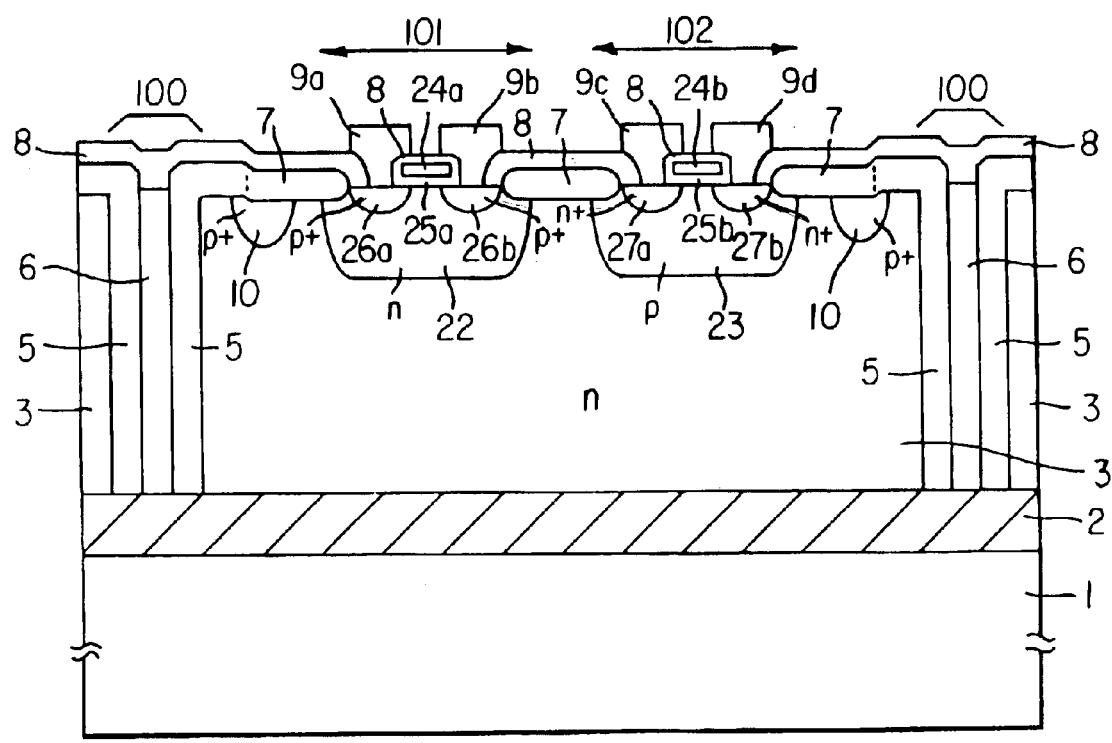
FIG. 16 is a cross-sectional view showing a process of manufacturing a semiconductor device, continuing from FIG. 15 according to the third embodiment of the present invention.

Thereafter, in a normal process of manufacturing a MOSFET, the p-type source region 26a, the p-type drain region 26b, the n-type source region 27a and the n-type drain region 27b are formed (FIG. 14), the interlayer insulating film 8 is formed (FIG. 15), and a metal electrodes, 9 which constitute the source electrodes 26a, 27a and the drain electrodes 26b, 27b are formed (FIG. 16). FIG. 16 is the same as FIG. 1b.

According to the third embodiment, the high-concentration impurity diffused region 10 is formed of boron, but it may be formed of phosphorous, arsenic, and fluorine singly or in combination. In either case, the amount of ions to be implanted is determined so that the surface concentration of the impurity diffused region 10 can be between $1 \times 10^{18}$ and $5 \times 10^{20}$ atom/cm$^3$.

This achieves a sufficient gettering effect, and increases the yield to 60% or more as shown in FIG. 2. The ions of a normal type used in the formation of the MOSFET are used, and thus, the impurity diffused region 10 can be formed using an ordinary manufacturing equipment.

Figure 17A:
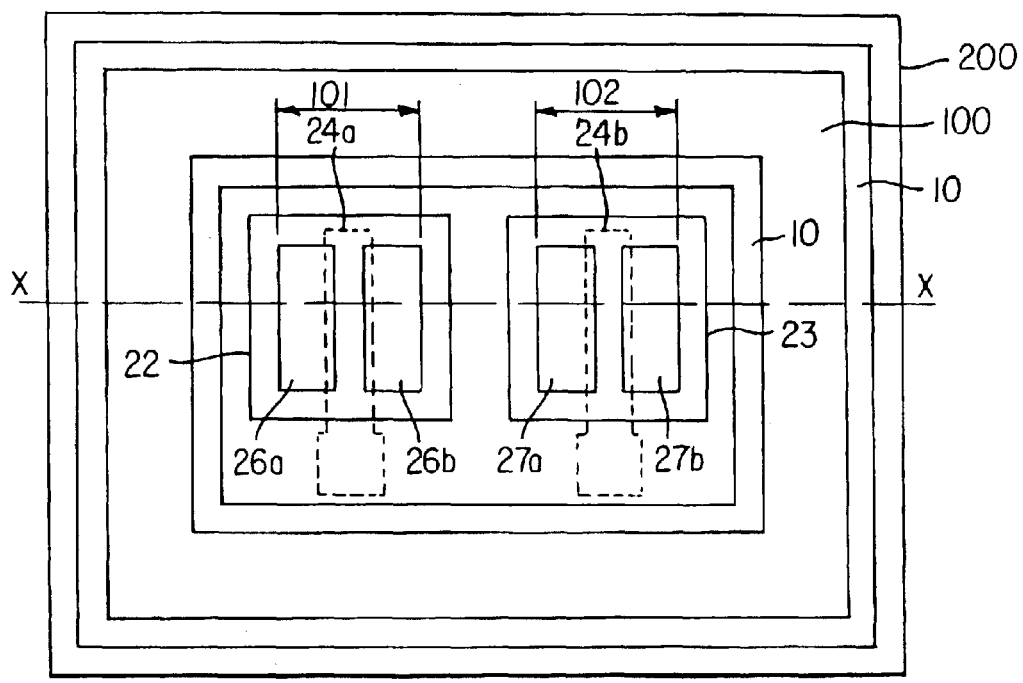
Figure 17B:
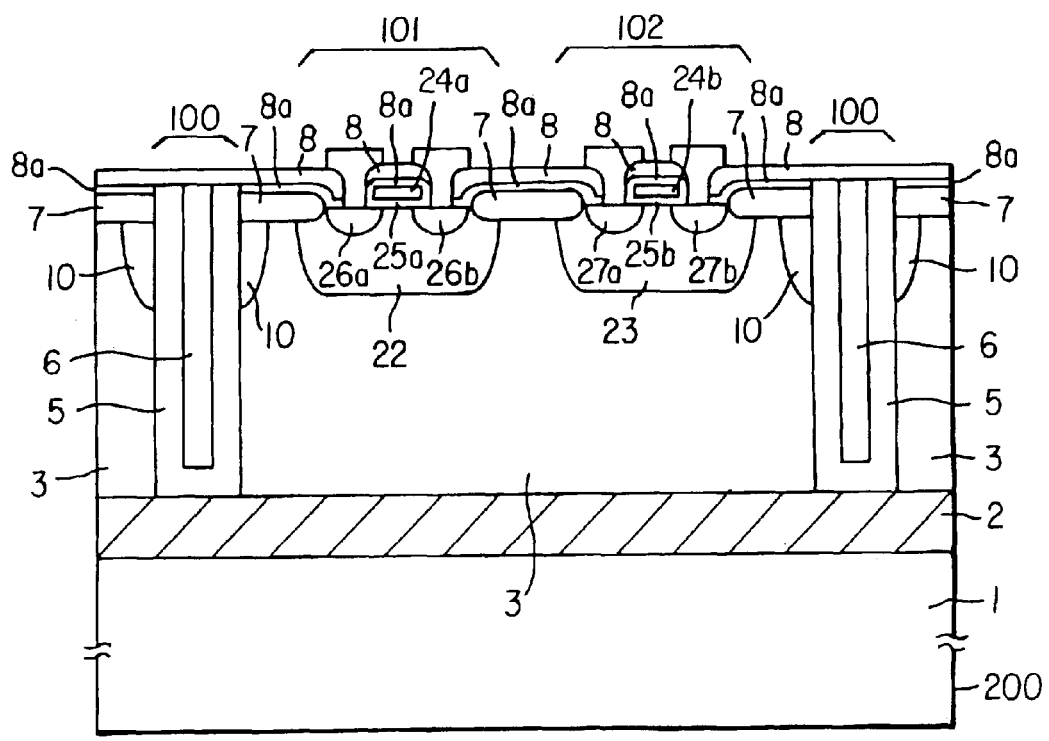

FIGS. 17a and 17b are views showing the structure of a semiconductor device according to a fourth embodiment of the present invention. FIG. 17a is a plan view, and FIG. 17b is a cross-sectional view showing a principal part of the semiconductor device taken along line X—X of FIG. 17a. FIG. 17a is described in reference with the surface of the semiconductor, and shows only a range with respect to the isolation region 100.

FIGS. 17a and 17b are different from FIGS. 1a and 1b in that its isolation region 100 is formed through the high-concentration impurity diffused region 10. The high-concentration impurity diffused region 10 is broader than the isolation region 100. In the embodiment of FIGS. 17a and 17b, while the high-concentration impurity diffused region 10 is formed at both sides of the isolation region 100, the high-concentration impurity diffused region 10 can be formed at only one side of the isolation region 100. Alternatively, the high-concentration impurity diffused region 10 can be formed inside the isolation region 100, and can be removed during the formation of the isolation region 100.

FIGS. 18–30 are cross-sectional views showing a method of manufacturing the semiconductor device of FIGS. 17a and 17b according to a fifth embodiment of the present invention. In FIGS. 18–30, the manufacturing method is described in the order of steps.

Figure 18:
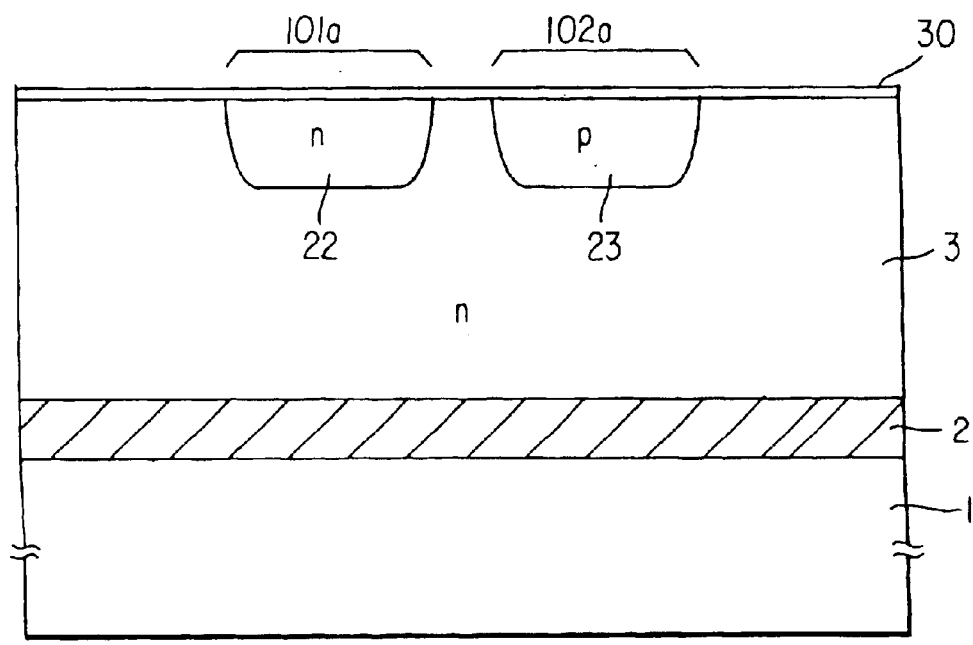
FIG. 18 is a cross-sectional view showing a process of manufacturing a semiconductor device according to the fifth embodiment of the present invention.

A buffer oxide film 30 (which may be called a screen oxide film) with a thickness of 20–40 nm is formed on the SOI substrate, which has a n-type semiconductor 3 with a thickness of 5–10 μm formed on the semiconductor substrate 1 with a thickness of about 630 μm through the first insulating layer 2 with a thickness of 1–3 μm, by a thermal oxidation method. Ions are selectively implanted into the forming regions 101a and 102a by a photolithography, and then they are heat-treated so that the p-type channel MOSFET and the n-type channel MOSFET can be formed in the n-type well region 22 and the p-type well region 23, respectively (FIG. 18).

Figure 19:
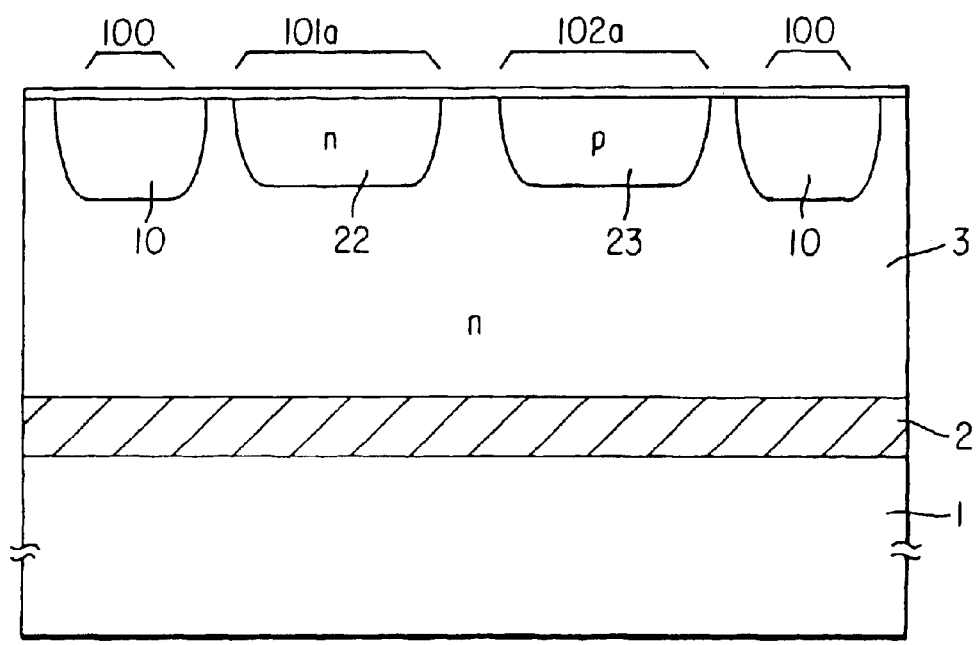
FIG. 19 is a cross-sectional view showing a process of manufacturing a semiconductor device, continuing from FIG. 18 according to the fifth embodiment of the present invention.

Then, the high-concentration impurity diffused region 10 is selectively formed in a broader region than the isolation region 100 where the isolation groove is formed (FIG. 19). According to this embodiment, boron is used as impurities to be diffused, and the impurity diffused region 10 is formed by implanting ions of $5.0 \times 10^{16}$ atom/cm$^3$ at an acceleration voltage of 80 keV. After the implantation of ions, the heat treatment is performed at 1100° C. for two hours. A surface concentration of the high-concentration impurity diffused region 10 formed under these conditions is $2.5 \times 10^{19}$ atom/cm$^3$ at the final stage after the manufacturing process.

Figure 20:
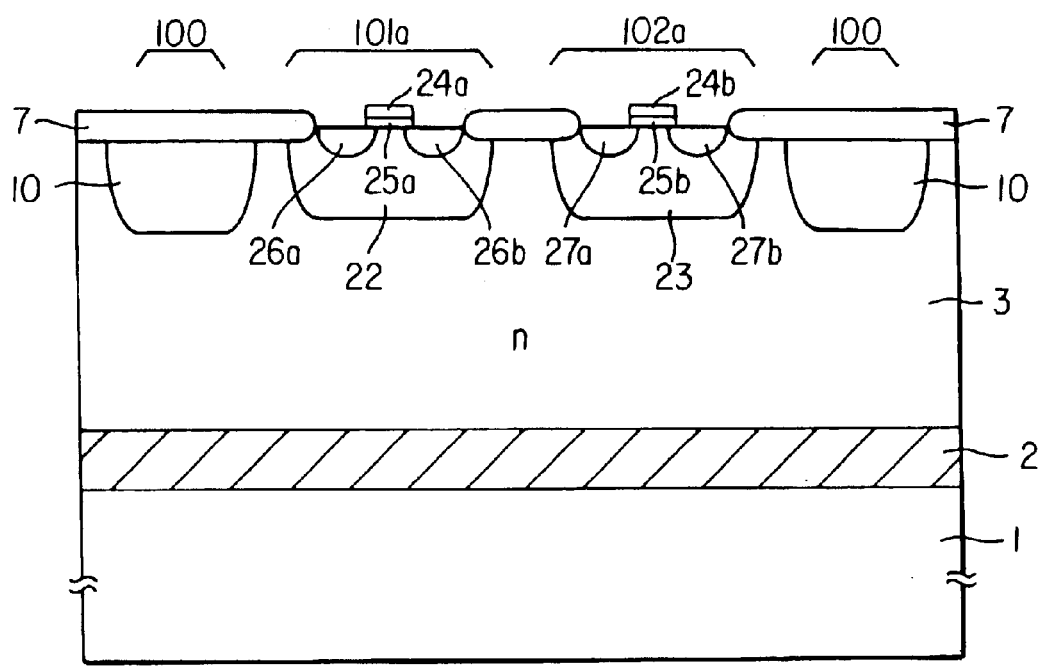
FIG. 20 is a cross-sectional view showing a process of manufacturing a semiconductor device, continuing from FIG. 19 according to the fifth embodiment of the present invention.

Next, the buffer oxide film 30 is removed, and the insulating film 7 is formed by a selective oxidation method. Then, the gate oxide films 25a, 25b and the gate electrodes 24a, 24b are formed in the p-type channel MOSFET forming region 101a and the n-type channel MOSFET forming region 102a. Further, the p-type source region 26a and the n-type drain region 26b are formed in the surface layer of the p-type well region 22, and the n-type source region 27a and the n-type drain region 27b are formed in the surface layer of the p-type well region 23 (FIG. 20).

Figure 21:
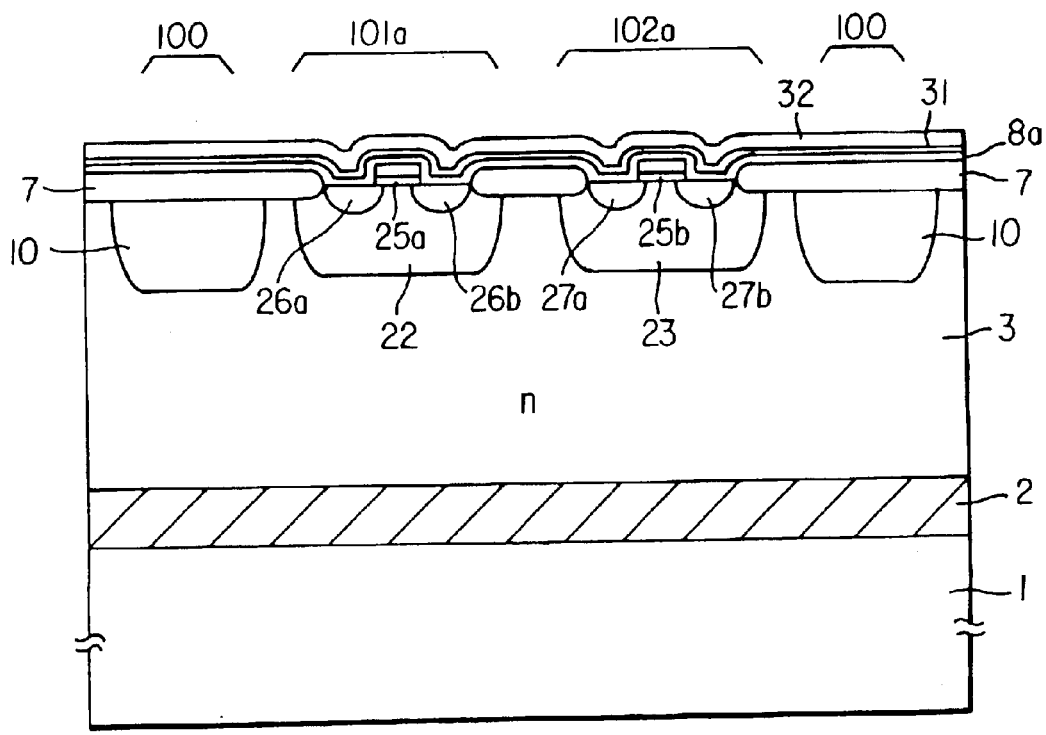
FIG. 21 is a cross-sectional view showing a process of manufacturing a semiconductor device, continuing from FIG. 20 according to the fifth embodiment of the present invention.

Next, an interlayer insulating film 8a, an etching stop film 31, and an etching mask film 32 are formed (FIG. 21). The interlayer insulating film 8a is an oxide silicon film that is formed by a chemical vapor deposition method, and has a thickness of 0.1–0.5 μm. The etching stop film 31 is a nitride silicon film or a polycrystal silicon film that is formed by the chemical vapor deposition method, and has a thickness of 0.1–0.5 μm. The etching mask film 32 is an oxide silicon film that is formed by the chemical vapor deposition method, and has a thickness of 1–2 μm.

Figure 22:
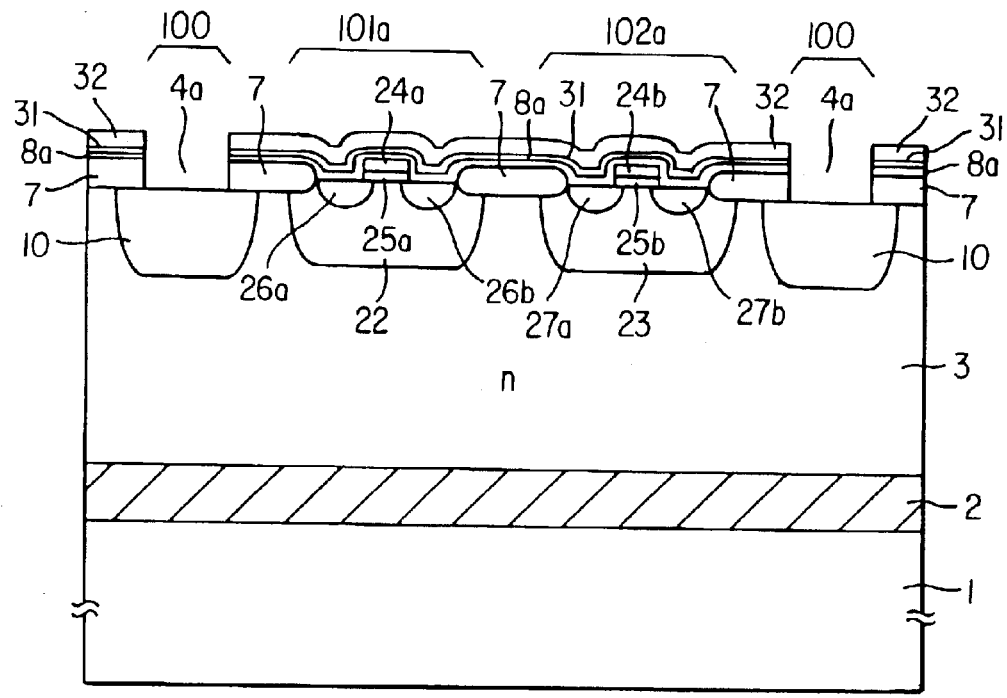
FIG. 22 is a cross-sectional view showing a process of manufacturing a semiconductor device, continuing from FIG. 21 according to the fifth embodiment of the present invention.
Figure 23:
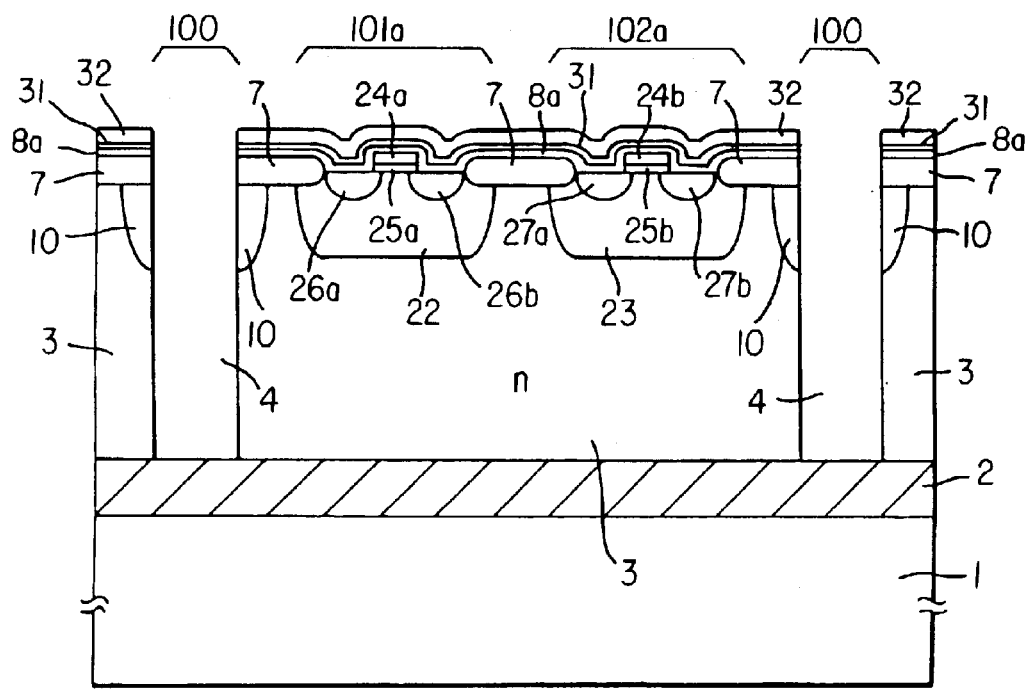
FIG. 23 is a cross-sectional view showing a process of manufacturing a semiconductor device, continuing from FIG. 22 according to the fifth embodiment of the present invention.

The interlayer insulating film 8a, the etching stop film 31, and the etching mask film 32 in the upper section of the high-concentration impurity diffused region 10 are selectively opened to form the opening part 4a by the photolithography (FIG. 22). Then, the isolation groove 4, which extends to or reaches the insulating film 2 with the etching mask film 32 acting as a mask, is formed by anisotropic etching (FIG. 23). An opening width of the isolation groove 4 is 1–3 μm.

Figure 24:
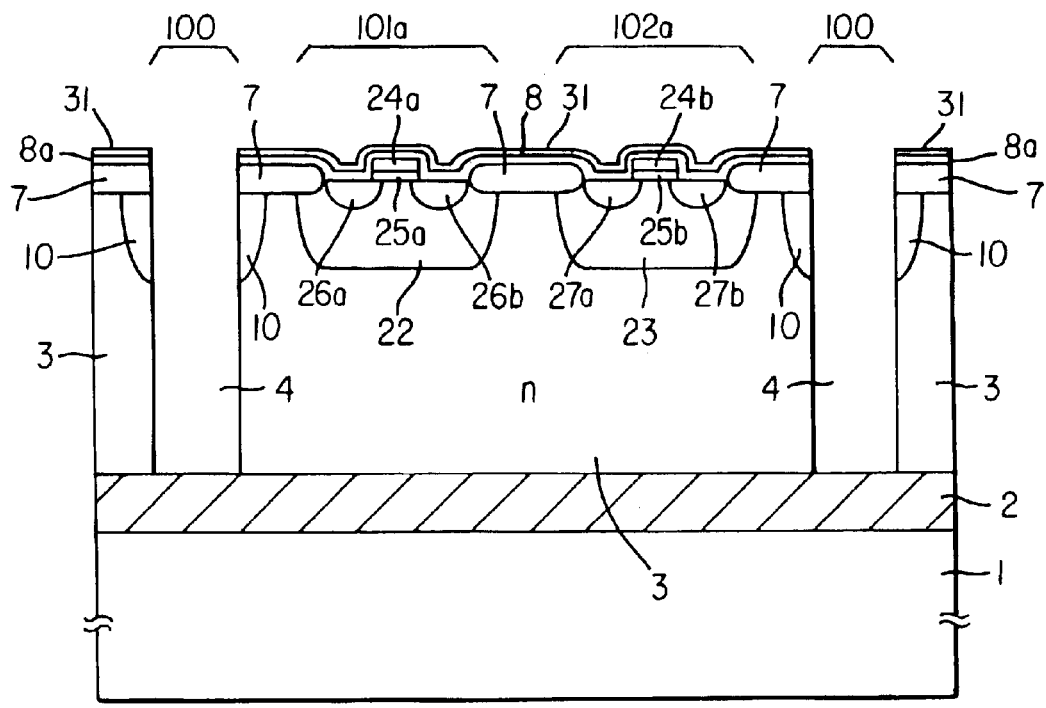
FIG. 24 is a cross-sectional view showing a process of manufacturing a semiconductor device, continuing from FIG. 23 according to the fifth embodiment of the present invention.

Then, the etching mask film 32 is completely removed by a diluted hydrofluoric acid solution or a dry etching process. An end point of the removal is specified by the etching stop film 31 (FIG. 24).

Figure 25:
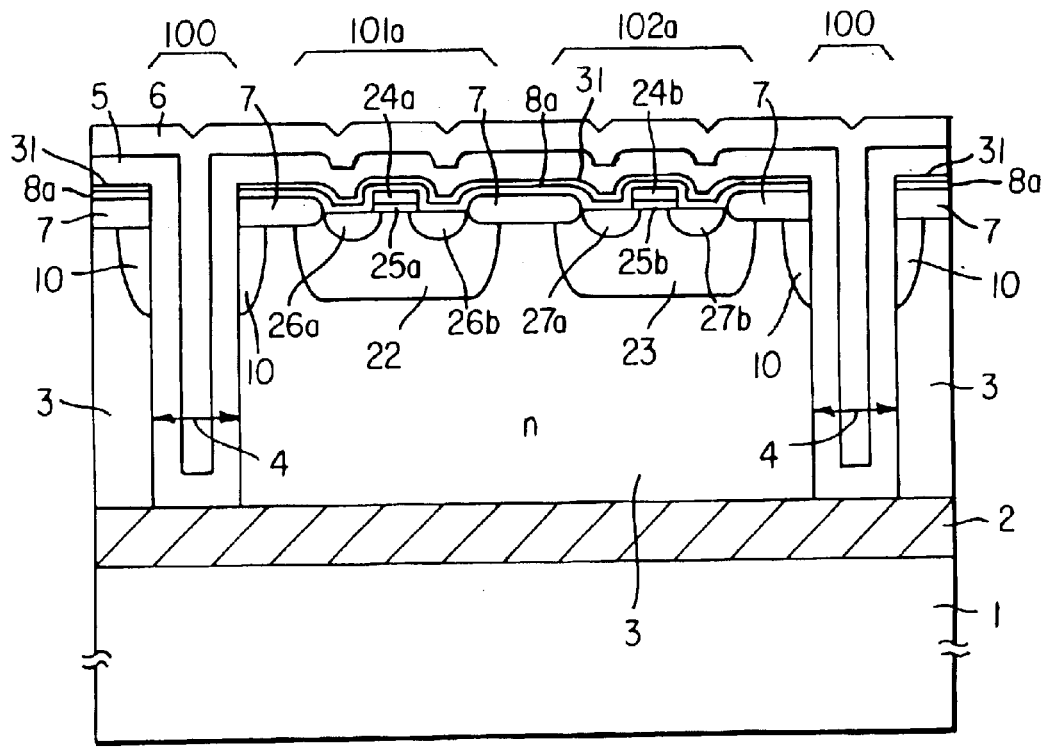
FIG. 25 is a cross-sectional view showing a process of manufacturing a semiconductor device, continuing from FIG. 24 according to the fifth embodiment of the present invention.

Then, the insulating film 5 is formed inside the isolation groove 4, and the filling layer 6 fills the isolation groove 4 (FIG. 25). The insulating film 5 is an oxide silicon film that is formed by the chemical vapor deposition method, and has a thickness of 0.4–1.0 μm. The filling layer 6 is a polycrystal silicon film that is formed by the chemical vapor deposition method, and has a thickness of 0.5–1.0 μm. If the width of the isolation groove 4 and the thickness of the insulating film 5 are optimized, only the insulating film 5 can completely fill the inside of the isolation groove 4.

Figure 26:
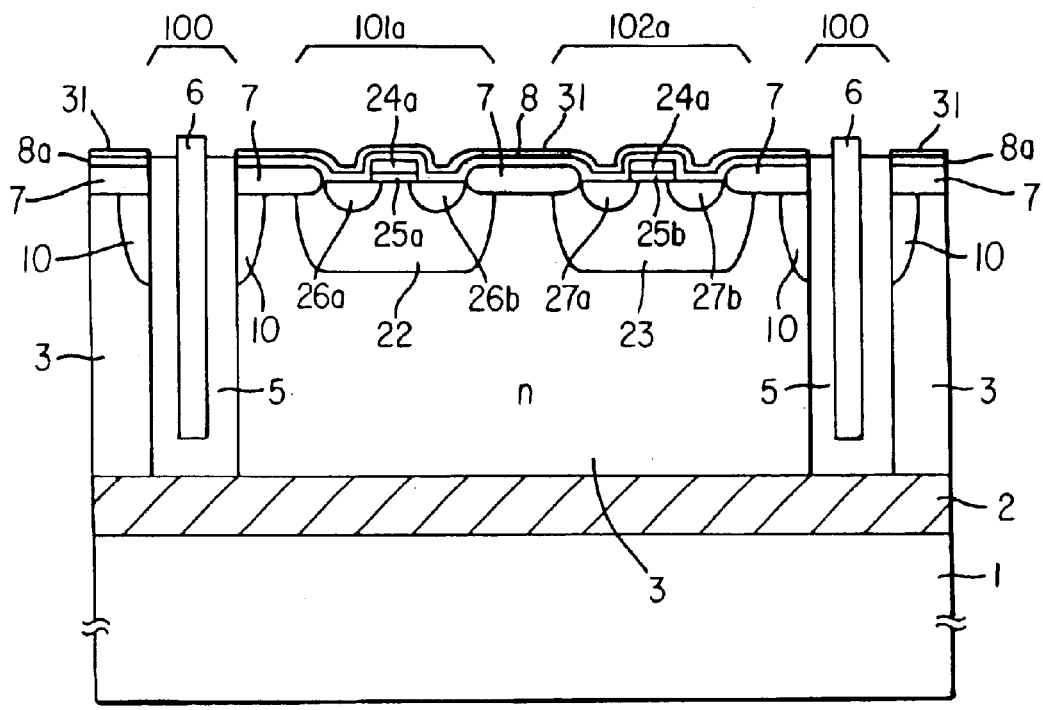
FIG. 26 is a cross-sectional view showing a process of manufacturing a semiconductor device, continuing from FIG. 25 according to the fifth embodiment of the present invention.
Figure 27:
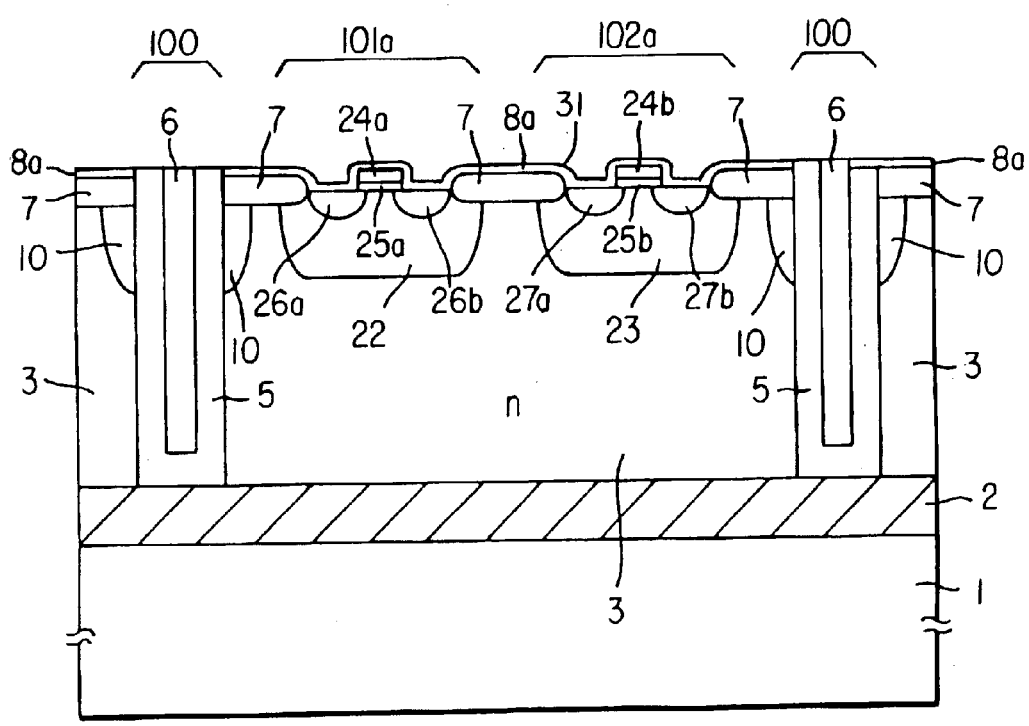
FIG. 27 is a cross-sectional view showing a process of manufacturing a semiconductor device, continuing from FIG. 26 according to the fifth embodiment of the present invention.

Then, the filling layer 6 adhered to the surface is removed by the dry etching process, and the insulating film 5 is removed by the diluted hydrofluoric acid solution or the dry etching process until the etching stop film 31 is exposed (FIG. 26).

Figure 28:
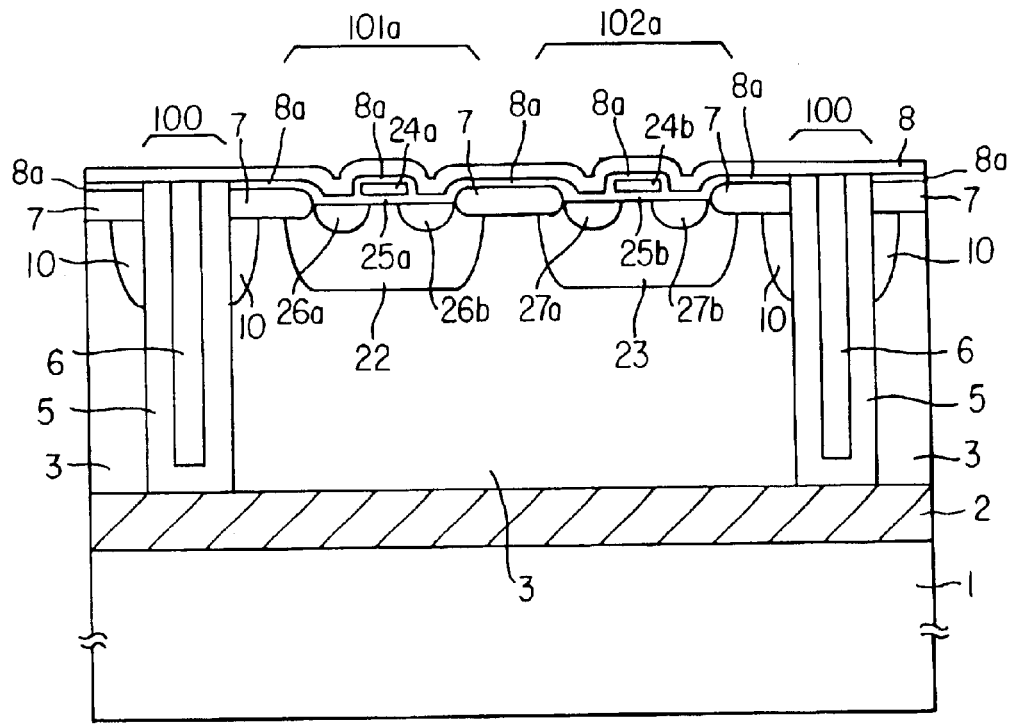
FIG. 28 is a cross-sectional view showing a process of manufacturing a semiconductor device, continuing from FIG. 27 according to the fifth embodiment of the present invention.
Figure 29:
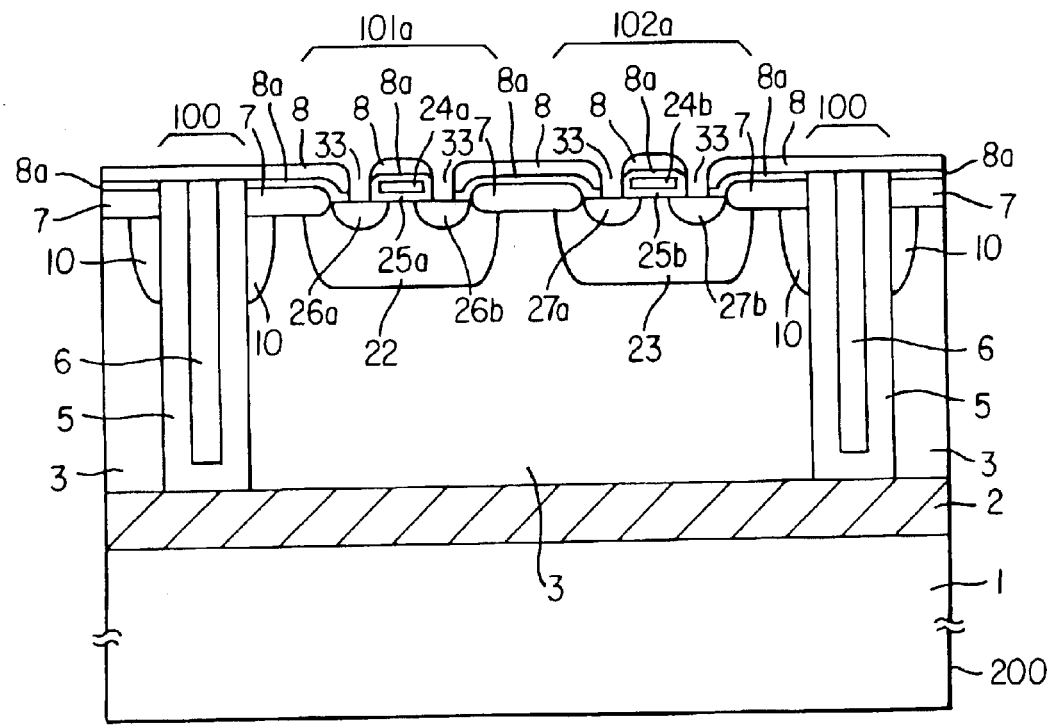
FIG. 29 is a cross-sectional view showing a process of manufacturing a semiconductor device, continuing from FIG. 28 according to the fifth embodiment of the present invention.
Figure 30:
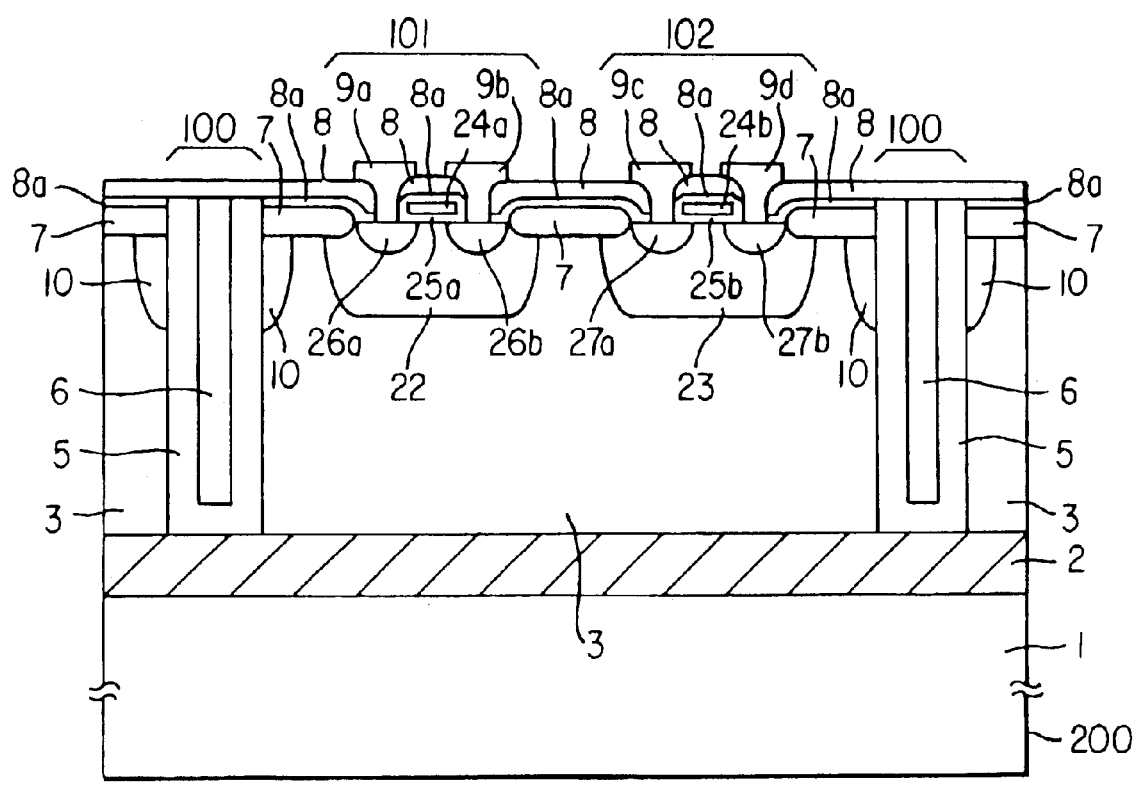
FIG. 30 is a cross-sectional view showing a process of manufacturing a semiconductor device, continuing from FIG. 29 according to the fifth embodiment of the present invention.

Then, the dry etching process removes the etching stop film 31 to expose the interlayer insulating film 8a. A convex part of the filling layer 6 is removed and flattened so that a surface height of the filling layer 6 can be equal to a surface height of the interlayer insulating film 8a. Then, an interlayer insulating film 8 is formed n the interlayer insulating film 8a, the insulating film 5, and the filling layer 6 (FIG. 28).

Thereafter, contact holes 33 that reach or extends to the p-type source region 26a, the p-type drain region 26b, the n-type source region 27a and the n-type drain region 27b of the p-type channel MOSFET and the n-type channel MOSFET (FIG. 29) are formed, and the source electrodes 9a, 9c and the drain electrodes 9b, 9d are formed by a metal film (FIG. 30) in the normal process of manufacturing the semiconductor device.

According to the present embodiment, the p-type channel MOSFET 101 and the n-type channel MOSFET 102 are given as examples, but a bipolar transistor, a diode and a high voltage MOSFET, which have the same structure of the high-concentration impurity diffused region 10 and the isolation region 100, can be manufactured in the same manner.

In the semiconductor device of the fourth embodiment, the high-concentration impurity diffused region 10 is formed in the surface layer of the n-type semiconductor layer 3 prior to the formation of the isolation groove 4 in the isolation region 100. This improves the electric characteristics of a diffused junction that forms the gate oxide films 25a, 25b, the source region and the drain region, and improves the yield and the reliability. Moreover, the following advantages can be achieved:

1) the size of the semiconductor device can be reduced by overlapping the high-concentration impurity diffused region 10 as the gettering layer for fixing the heavy metal and the isolation groove 4 as the isolation region for isolating the devices; and 2) the gettering of the heavy metal can be performed satisfactorily since the isolation groove 4 is formed after the high-concentration impurity diffused region 10 is formed prior to the formation of the gate oxide film 25a, 25b deteriorated by the heavy metal pollution and the formation of the diffused junction.

For example, the reduction in the size of the semiconductor device is considered one-dimensional. If an effective width and an isolation groove width of the high-concentration impurity diffused region 10 for achieving the satisfactory gettering for the n-type semiconductor device specified by the isolation groove are 5 $\mu$m and 2 $\mu$m, respectively; the width of a region required for the high-concentration impurity diffused region 10 and the isolation groove 4 is 7 $\mu$m at one side and is 14 $\mu$m at both sides of the region specified by the isolation groove 4. According to the present invention, the high-concentration impurity diffused region 10 and the isolation groove 4 can be formed in the width of 5 $\mu$m. It is therefore possible to reduce the width at one side of the region specified by the isolation groove 4 by 2 $\mu$m. For example, if the semiconductor device is comprised of fifty isolation regions, it is possible to reduce the size of the semiconductor by 2 $\mu$m×2(both sides)×50 (isolation regions)=200 $\mu$m.

According to the present invention, the high-concentration impurity diffused region is formed with a surface concentration of between $1\times10^{18}$ atom/cm$^3$ and $5\times10^{20}$ atom/cm$^3$ before the formation of the gate oxide films. The impurities in the impurity diffused region are at least one of the following: boron, phosphorous, arsenic and fluorine. This improves the gate withstand voltage and the source-to-drain withstand voltage of the semiconductor device, and consequently improves the yield.

Moreover, the high-concentration impurity diffused region is formed in advance in the isolation groove forming region on the surface of the semiconductor layer. This improves the gate withstand voltage and the source-to-drain withstand voltage, and consequently improves the yield.

In addition, the impurity diffused region and the isolation groove for isolating the devices are overlapped to reduce the size of the semiconductor device and improves the gettering effect.

What is claimed is:

1. A semiconductor device, which is formed by an SOI (Silicon On Insulator) substrate on which a semiconductor layer is formed on a semiconductor substrate through an insulating film, and in which semiconductor elements are formed in said semiconductor layer of said SOI substrate, said semiconductor device wherein:

an impurity diffused region with a surface concentration of between $1\times10^{18}$ atom/cm$^3$ and $5\times10^{20}$ atom/cm$^3$ is formed around activation regions in which said semiconductor elements are formed.

2. A semiconductor device according to claim 1, wherein said impurity diffused region is adjacent to said activation regions or in close proximity to said activation regions.

3. A semiconductor device, which is formed by an SOI (Silicon On Insulator) substrate on which a semiconductor layer is formed on a semiconductor substrate through an insulating film, and in which isolation regions divide said semiconductor layer of the SOI substrate into island regions and semiconductor elements are formed in activation regions in said island regions, said semiconductor device wherein:

an impurity diffused region with a surface concentration of between $1\times10^{18}$ atom/cm$^3$ and $5\times10^{20}$ atom/cm$^3$ is formed between said activation regions and said isolation region.

4. A semiconductor device according to claim 2, wherein said insulating film is formed by thermally oxidizing on said impurity diffused region.

5. A semiconductor device according to claim 3, wherein said insulating film is formed by thermally oxidizing on said impurity diffused region.

6. A semiconductor device
an SOI (Silicon On Insulator) substrate having a semiconductor substrate and an insulating film on the semiconductor substrate, and a semiconductor layer on said insulating film;

semiconductor elements formed on the semiconductor layer;

a preformed impurity diffused region in the semiconductor layer; and an isolation groove formed through said impurity diffused region and extending to the insulating film.

7. A semiconductor device according to claim 6, wherein a surface concentration of said impurity diffused region is between $1\times10^{18}$ atom/cm$^3$ and $5\times10^{20}$ atom/cm$^3$.

8. A semiconductor device according to claim 6, wherein said isolation groove filled with polycrystal silicon through an oxide film.

9. A semiconductor device according to claim 7, wherein said isolation groove is filled with polycrystal silicon through an oxide film.

10. A semiconductor device according to claim 6, wherein said isolation groove is filled with an oxide film.

11. A semiconductor device according to claim 7 wherein said isolation groove is filled with an oxide film.

* * * * *

UNITED STATES PATENT AND TRADEMARK OFFICE
CERTIFICATE OF CORRECTION

PATENT NO. : 6,774,454 B2
DATED : August 10, 2004
INVENTOR(S) : Atsuo Hirabayashi It is certified that error appears in the above-identified patent and that said Letters Patent is hereby corrected as shown below:

<u>Title page, Item [54] and Column 1, line 1</u>,
Title, delete "SEMICONDUCTOR DEVICE WITH AN SILICON INSULATOR (SOI) SUBSTRATE" and insert -- SEMICONDUCTOR DEVICE WITH AN SILICON ON INSULATOR (SOI) SUBSTRATE --.

Signed and Sealed this

Twenty-eighth Day of December, 2004

JON W. DUDAS
*Director of the United States Patent and Trademark Office*